United States Patent
Liu et al.

(10) Patent No.: US 8,142,702 B2
(45) Date of Patent: Mar. 27, 2012

(54) SOLVENT-ASSISTED LAYER FORMATION FOR IMPRINT LITHOGRAPHY

(75) Inventors: Weijun Liu, Austin, TX (US); Frank Y. Xu, Round Rock, TX (US); Edward Brian Fletcher, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 98 days.

(21) Appl. No.: 12/139,911

(22) Filed: Jun. 16, 2008

(65) Prior Publication Data
US 2008/0308971 A1 Dec. 18, 2008

Related U.S. Application Data

(60) Provisional application No. 60/944,586, filed on Jun. 18, 2007.

(51) Int. Cl.
*B29C 59/00* (2006.01)
*H01L 21/027* (2006.01)

(52) U.S. Cl. ............... 264/293; 427/421.1; 427/427.2; 427/600

(58) Field of Classification Search .............. 264/401, 264/496, 293; 427/421.1, 427.2, 427.4, 600
See application file for complete search history.

(56) References Cited

U.S. PATENT DOCUMENTS

| | | | |
|---|---|---|---|
| 4,996,080 A * | 2/1991 | Daraktchiev | 427/600 |
| 5,736,195 A * | 4/1998 | Haaland | 427/180 |
| 6,135,357 A | 10/2000 | Herrin et al. | |
| 6,334,960 B1 | 1/2002 | Willson et al. | |
| 6,517,995 B1 * | 2/2003 | Jacobson et al. | 430/320 |
| 6,719,915 B2 | 4/2004 | Willson et al. | |
| 6,873,087 B1 | 3/2005 | Choi et al. | |
| 6,884,564 B2 * | 4/2005 | Feiring et al. | 430/270.1 |
| 6,900,126 B2 * | 5/2005 | Carter et al. | 438/678 |
| 6,900,881 B2 | 5/2005 | Sreenivasan et al. | |
| 6,926,929 B2 | 8/2005 | Watts et al. | |
| 6,932,934 B2 | 8/2005 | Choi et al. | |
| 6,936,194 B2 | 8/2005 | Watts | |

(Continued)

FOREIGN PATENT DOCUMENTS

JP 06-151295 * 5/1994

(Continued)

OTHER PUBLICATIONS

3M Product Catalog, Dec. 25, 2005, [online], [retrieved Nov. 6, 2009] Retrieved from Wayback Machine Internet Archive<URL:http://web.archive.org/web/20051225005010/http://products3.3m.com/catalog/us/en001/oil_gas/specialty_materials/node_2CT5BPQWKBge/root_GST1T4S9TCgv/vroot_G1F6DNZDBVge/theme_us_oilgas_3_0/command_AbcPageHandler/output_html>.*

(Continued)

*Primary Examiner* — Richard Crispino
*Assistant Examiner* — Robert Dye
(74) *Attorney, Agent, or Firm* — Heather L. Flanagan; Fish & Richardson P.C.

(57) ABSTRACT

A solid layer is formed by applying a multiplicity of discrete portions of a fluid composition onto a surface of an imprint lithography substrate, and allowing the discrete portions of the composition to spontaneously spread on the surface of the substrate to form a substantially continuous layer. The composition includes a solvent and a solid or a solvent and a polymerizable material. The composition can be a solution or a dispersion. At least some of the solvent is evaporated from the composition, and a solid layer is formed (e.g., polymerized or dried) on the substrate. The solid layer is substantially free of interstitial voids.

36 Claims, 4 Drawing Sheets

U.S. PATENT DOCUMENTS

| | | | |
|---|---|---|---|
| 7,077,992 B2 | 7/2006 | Sreenivasan et al. | |
| 7,125,584 B2 * | 10/2006 | Ito | 427/424 |
| 7,157,036 B2 | 1/2007 | Choi et al. | |
| 7,179,396 B2 | 2/2007 | Sreenivasan | |
| 7,259,102 B2 | 8/2007 | Wang et al. | |
| 7,282,550 B2 | 10/2007 | Xu et al. | |
| 7,307,118 B2 | 12/2007 | Xu et al. | |
| 2003/0036016 A1 | 2/2003 | Szmanda et al. | |
| 2003/0232252 A1 | 12/2003 | Mancini et al. | |
| 2004/0008334 A1 | 1/2004 | Sreenivasan et al. | |
| 2004/0065252 A1 | 4/2004 | Sreenivasan et al. | |
| 2004/0065976 A1 | 4/2004 | Sreenivasan et al. | |
| 2004/0097072 A1 | 5/2004 | Carter et al. | |
| 2004/0110856 A1 | 6/2004 | Young et al. | |
| 2004/0170770 A1 | 9/2004 | Nguyen et al. | |
| 2004/0209188 A1 | 10/2004 | Szmanda et al. | |
| 2004/0211754 A1 | 10/2004 | Sreenivasan | |
| 2005/0061773 A1 | 3/2005 | Choi et al. | |
| 2005/0158419 A1 | 7/2005 | Watts et al. | |
| 2005/0187339 A1 | 8/2005 | Xu et al. | |
| 2005/0236739 A1 | 10/2005 | Willson et al. | |
| 2006/0060839 A1 | 3/2006 | Chandross et al. | |
| 2006/0063112 A1 | 3/2006 | Sreenivasan | |
| 2006/0081557 A1 | 4/2006 | Xu et al. | |
| 2006/0111454 A1 * | 5/2006 | Xu et al. | 516/199 |
| 2007/0051916 A1 * | 3/2007 | Flynn et al. | 252/71 |
| 2007/0102838 A1 * | 5/2007 | Simon | 264/40.1 |
| 2007/0257396 A1 * | 11/2007 | Wang et al. | 264/219 |
| 2008/0174046 A1 | 7/2008 | Choi et al. | |

FOREIGN PATENT DOCUMENTS

WO    WO 2005/120834 A2    12/2005

OTHER PUBLICATIONS

MSDS for HFE-7000, [online], [retrieved Nov. 6, 2009]. 3M Company, Apr. 17, 2009 [retrieved Nov. 6, 2009]. Retrieved from Internet: <URL:http://multimedia.3m.com/mws/mediawebserver?66666UtN&ZUxL99XIxfVnXMEIVu9KcuZgVU_LXT1u666666-->.*

Pham et al. Direct Spray Coating of Photoresist—a New Method for Patterning 3-D Structures, the 16th European Conference on Solid-State Transducers, Sep. 16-18, 2002, Czech Republic.

PCT/US08/07525 International Search Report, Sep. 16, 2008.

* cited by examiner

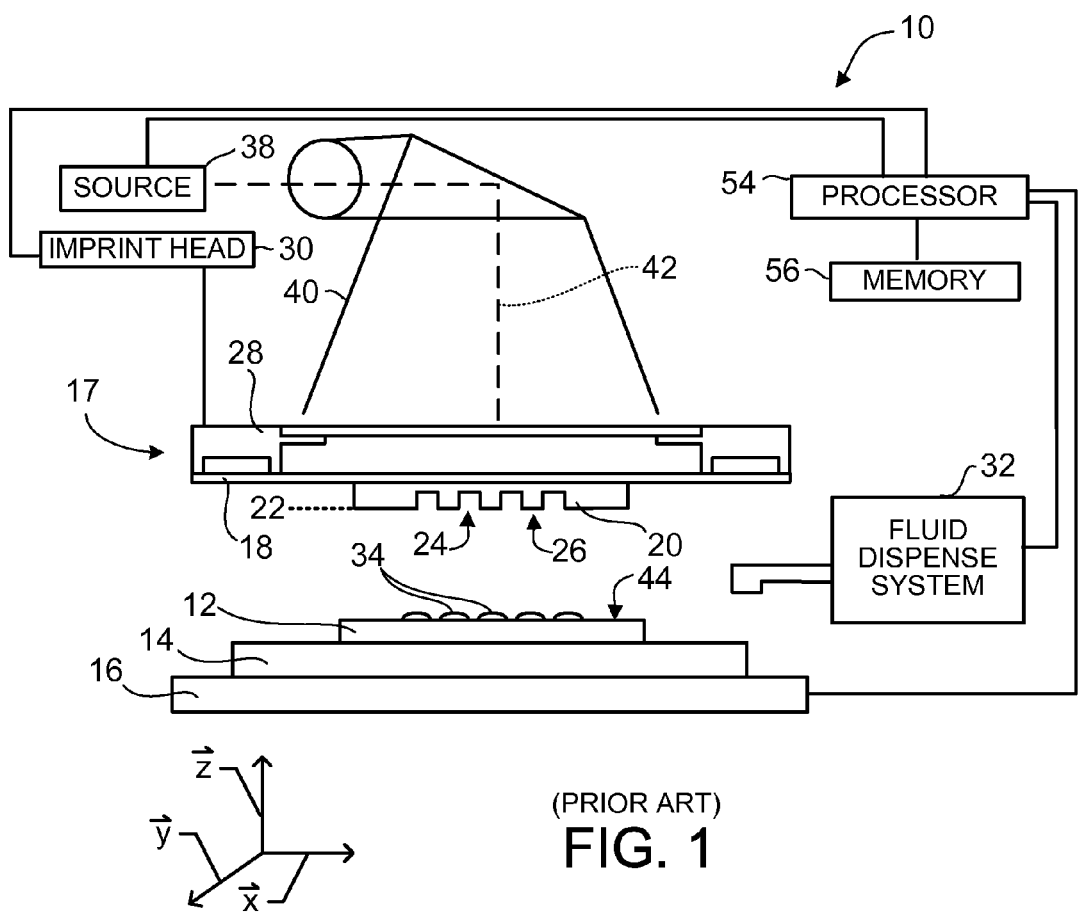
(PRIOR ART)
FIG. 1
(PRIOR ART)
FIG. 2

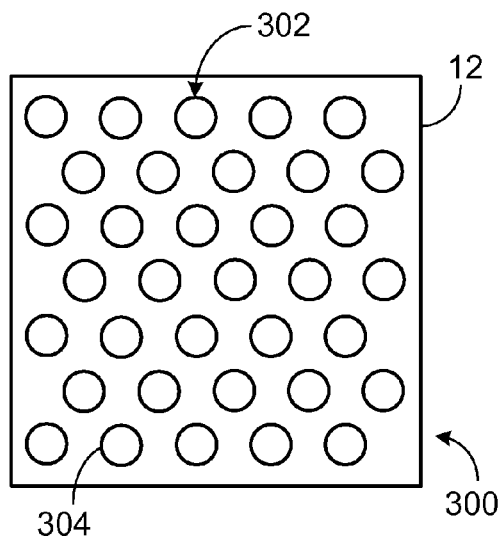
FIG. 3A
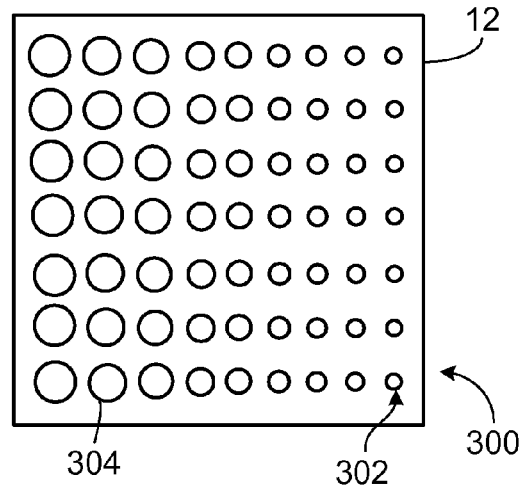
FIG. 3B
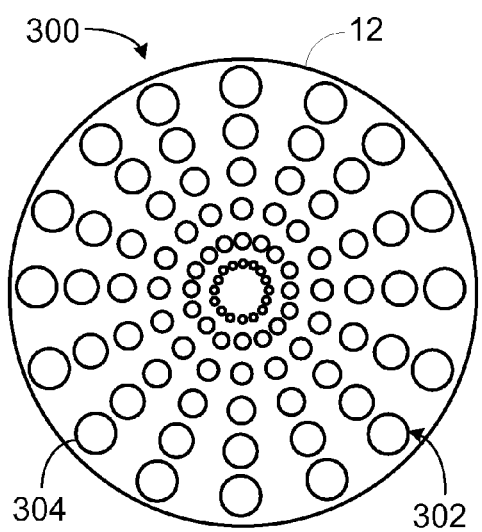
FIG. 3C
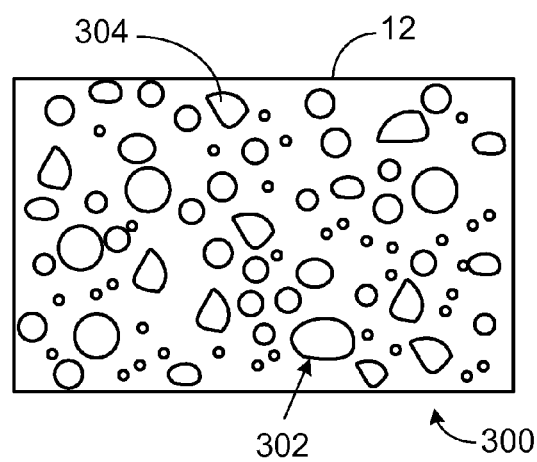
FIG. 3D

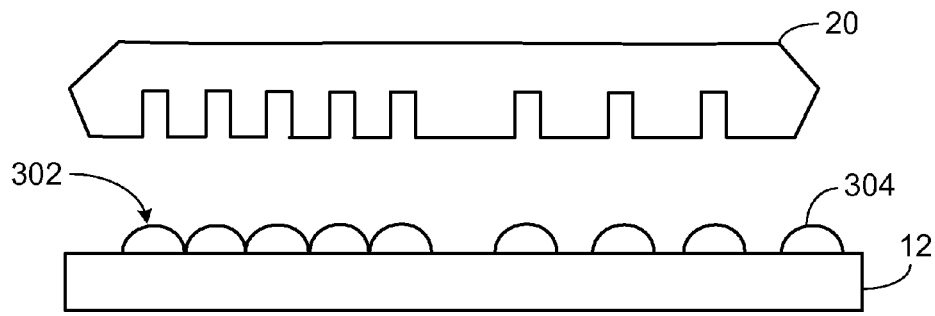
FIG. 4
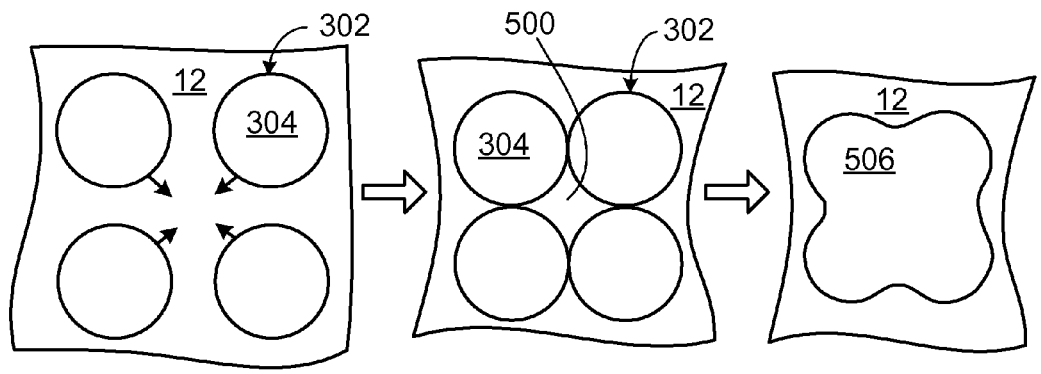
FIG. 5
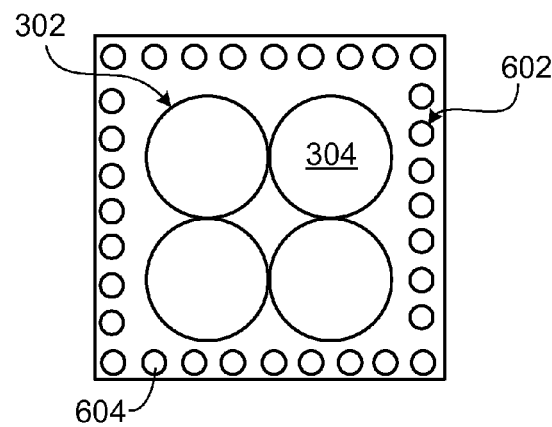
FIG. 6

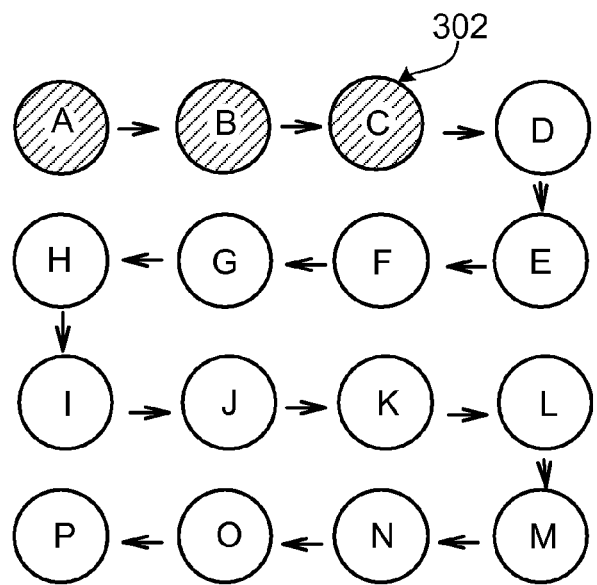
FIG. 7
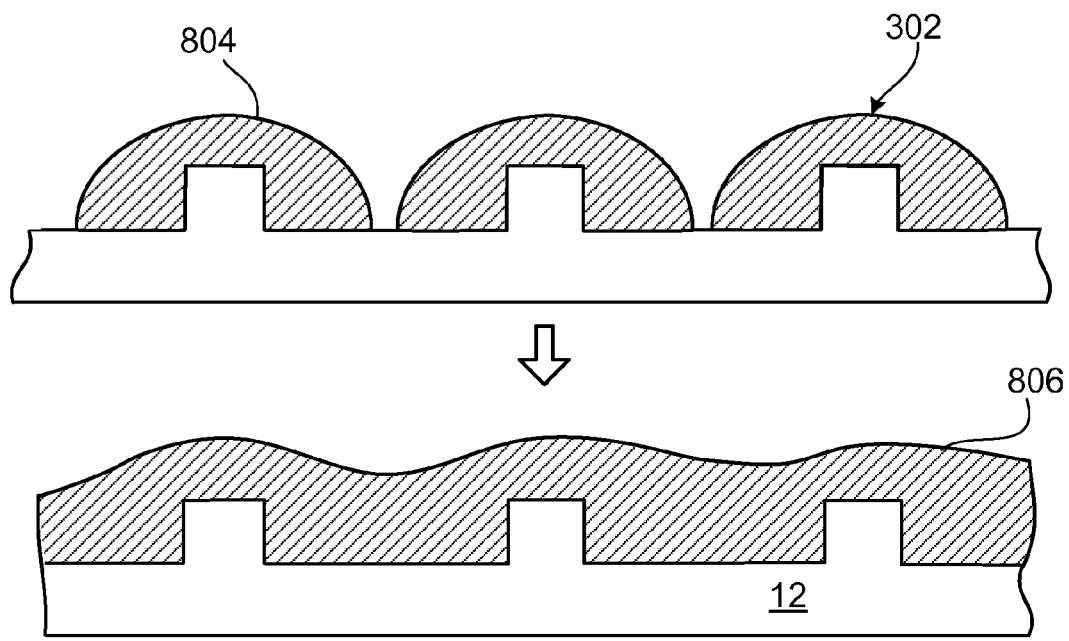
FIG. 8

SOLVENT-ASSISTED LAYER FORMATION FOR IMPRINT LITHOGRAPHY

CROSS-REFERENCE TO RELATED APPLICATIONS

This application claims the benefit under 35 U.S.C. §119 (e)(1) of U.S. provisional application 60/944,586, filed Jun. 18, 2007, which is incorporated by reference herein in its entirety.

STATEMENT OF GOVERNMENT INTEREST

This work was supported by NIST ATP Award No. 70NANB4H3012, thus the U.S. Government may have certain rights in the invention.

TECHNICAL FIELD

This invention relates to solvent-assisted layer formation in imprint lithography.

BACKGROUND

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States Patent Application Publication No. 2004/0065976, entitled "Method to Arrange Features on a Substrate to Replicate Features having Minimal Dimensional Variability;" United States Patent Application Publication No. 2004/0065252, entitled "Method of Forming a Layer on a Substrate to Facilitate Fabrication of Metrology Standards;" and U.S. Pat. No. 6,936,194, entitled "Functional Patterning Material for Imprint Lithography Processes," all of which are incorporated by reference herein in their entirety.

The imprint lithography techniques disclosed in the aforementioned publications and patent include forming a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable fluid composition present between the template and the substrate. The fluid composition is polymerized to form a solidified layer that has a pattern recorded therein that is conforming to a shape of the surface of the template in contact with the composition. The template is then separated from the solidified layer such that the template and the substrate are spaced-apart. The substrate and the solidified layer are then subjected to processes to transfer, into the substrate, a relief image that corresponds to the pattern in the solidified layer.

Spin coating techniques are sometimes used to form a layer of polymerizable material on a substrate before imprinting. However, the layer that results from spin coating can yield a non-uniform residual layer after imprinting, for example, if the template feature density is non-uniform. Furthermore, spin coating techniques can result in particle contamination of at least one side of a substrate (e.g., a wafer) if double-sided imprinting is needed.

Drop-on-demand dispensing methods can be used to form liquid layers on a substrate that result in a more nearly uniform residual layer after imprinting. However, gases trapped in the interstitial regions between drops of polymerizable liquid on the substrate can inhibit spreading and coalescence of the drops on the substrate. Defects such as interstitial voids can result in the polymerized layer when the polymerizable material forms a non-continuous layer on the substrate before imprinting. The amount of time required to expel gas from the interstitial regions can reduce throughput of an imprint lithography process.

Spin coating and drop-on-demand methods can include adding a surfactant to a polymerizable material to enhance release performance from a template. Additionally, at the fluid spread front, the surfactant can interact with the substrate. In some cases, the presence of a surfactant can limit the spreading of the material through, for example, a pinning effect.

SUMMARY

In one aspect, an imprint lithography method includes applying a multiplicity of discrete portions of a fluid composition onto a surface of an imprint lithography substrate, and allowing the discrete portions of the composition to spontaneously spread on the surface of the substrate to form a substantially continuous layer. The composition can include a solvent and a polymerizable material or a solvent and a solid. At least some of the solvent is evaporated from the fluid composition, and a solid layer substantially free of interstitial voids is formed on the substrate. Forming the solid layer can include polymerizing the polymerizable material. The solvent can include $R_f$—X—R, where $R_f$ includes fluorine and carbon, R includes an alkyl group, and X is a divalent atom.

BRIEF DESCRIPTION OF DRAWINGS

FIG. 1 is a diagram of a nano-imprint lithography system.
FIG. 2 is a diagram of a patterned layer formed on a substrate.
FIGS. 3A-D depict multiplicities of discrete portions of a fluid composition on a substrate.
FIG. 4 depicts a non-uniform distribution of discrete portions of a fluid composition on a substrate.
FIG. 5 depicts spreading of discrete portions of a fluid composition on a substrate to form a substantially continuous layer.
FIG. 6 depicts discrete portions of a fluid composition surrounded by discrete portions of a more viscous fluid.
FIG. 7 depicts sequential application of multiplicities of discrete portions of a fluid composition to a substrate.
FIG. 8 depicts spreading of a fluid composition on a patterned substrate.

DETAILED DESCRIPTION

Referring to FIG. 1, a system 10 to form a relief pattern on a substrate 12 is shown. Substrate 12 may include materials such as, for example, fused silica, quartz, silicon, organic polymers, siloxane polymers, borosilicate glass, fluorocarbon polymers, metal, plastics, gallium arsenide, mercury telluride, hardened sapphire, and any composite thereof. Additionally, substrate 12 may include one or more layers, e.g., dielectric layer, metal layer, semiconductor layer, planarization layer and the like. Substrate 12 may be coupled to a substrate chuck 14. As shown, substrate chuck 14 is a vacuum chuck, however, substrate chuck 14 may be any chuck including, but not limited to, vacuum, pin-type, groove-type, or electromagnetic, as described in U.S. Pat. No. 6,873,087, entitled "High-Precision Orientation Alignment and Gap Control Stages for Imprint Lithography Processes," which is incorporated herein by reference. Substrate 12 and substrate chuck 14 may be supported upon a stage 16. Further, stage 16, substrate 12, and substrate chuck 14 may be positioned on a base. Stage 16 may provide motion about the x and y axes.

Spaced-apart from substrate 12 is a patterning device 17. Patterning device 17 includes a template 18 having a mesa 20 extending therefrom towards substrate 12 with a patterning surface 22 thereon. Further, mesa 20 may be referred to as a mold 20. Mesa 20 may also be referred to as a nanoimprint mold 20. In a further embodiment, template 18 may be substantially absent of mold 20. Template 18 and mold 20 may be formed from materials including, but not limited to, fused-silica, quartz, silicon, organic polymers, siloxane polymers, borosilicate glass, fluorocarbon polymers, metal, plastics, gallium arsenide, mercury telluride, hardened sapphire, and any composite thereof. Additionally, mold 20 may be formed from several materials, e.g., indium tin oxide, diamond-like carbon, MoSi, sol-gels and the like. As shown, patterning surface 22 includes features defined by a plurality of spaced-apart recesses 24 and protrusions 26. However, in a further embodiment, patterning surface 22 may be substantially smooth and/or planar. Patterning surface 22 may define an original pattern that forms the basis of a pattern to be formed on substrate 12. Template 18 may be coupled to a template chuck 28, template chuck 28 being any chuck including, but not limited to, vacuum, pin-type, groove-type, or electromagnetic, as described in U.S. Pat. No. 6,873,087. Further, template chuck 28 may be coupled to an imprint head 30 to facilitate movement of template 18, and therefore, mold 20.

System 10 further includes a fluid dispense system 32. Fluid dispense system 32 may be in fluid communication with substrate 12 so as to apply polymerizable material 34 thereto. System 10 may include any number of fluid dispensers, and fluid dispense system 32 may include a plurality of dispensing units therein. Polymerizable material 34 may be applied to substrate 12 using any known technique, e.g., drop dispense, spray coating, spin coating, dip coating, chemical vapor deposition (CVD), physical vapor deposition (PVD), thin film deposition, thick film deposition, and the like. Typically, polymerizable material 34 is disposed upon substrate 12 before the desired volume is defined between mold 20 and substrate 12. However, polymerizable material 34 may fill the volume after the desired volume has been obtained.

Referring to FIGS. 1 and 2, system 10 further includes a source 38 of energy 40 coupled to direct energy 40 along a path 42. Imprint head 30 and stage 16 are configured to arrange mold 20 and substrate 12, respectively, to be in superimposition and disposed in path 42. Either imprint head 30, stage 16, or both vary a distance between mold 20 and substrate 12 to define a desired volume therebetween that is filled by polymerizable material 34. After the desired volume is filled with polymerizable material 34, source 38 produces energy 40, e.g., broadband ultraviolet radiation that causes polymerizable material 34 to solidify and/or cross-link, conforming to the shape of a surface 44 of substrate 12 and patterning surface 22, defining a patterned layer 46 on substrate 12. Patterned layer 46 may include a residual layer 48 and a plurality of features shown as protrusions 50 and recessions 52. In some cases, a thickness of the residual layer 48 is between about 0 nm and about 100 nm. The lateral (or critical) dimension (or width of protrusion 50) can be between about 5 nm and about 500 μm, with a spacing (or width of recession 52) of about 5 nm to about 500 μm between protrusions. A height of protrusions 50 is between about 0 and 500 nm. System 10 may be regulated by a processor 54 that is in data communication with stage 16, imprint head 30, fluid dispense system 32, and source 38, operating on a computer readable program stored in memory 56.

The above-mentioned may be further be employed in imprint lithography processes and system referred to in U.S. Pat. No. 6,932,934, entitled "Formation of Discontinuous Films During an Imprint Lithography Process;" U.S. Pat. No. 7,077,992, entitled "Step and Repeat Imprint Lithography Processes;" U.S. Pat. No. 7,179,396, entitled "Positive Tone Bi-Layer Imprint Lithography Method;" and United States Patent Application Publication No. 2004/0211754, entitled "Method of Forming Stepped Structures Employing Imprint Lithography," all of which are incorporated by reference herein. In a further embodiment, the above-mentioned may be employed in any known technique, e.g., photolithography (various wavelengths including G line, I line, 248 nm, 193 nm, 157 nm, and 13.2-13.4 nm), contact lithography, e-beam lithography, x-ray lithography, ion-beam lithography and atomic beam lithography.

Discrete portions of a fluid composition can be applied to an imprint lithography substrate to form a multiplicity of discrete portions on a surface of the substrate. The multiplicity can be a pattern or a random distribution of discrete portions. The composition can be a mixture (e.g., solution or dispersion) of a solvent and a solid, a solvent and a polymerizable material, or any combination thereof. The polymerizable material can be in the solid or liquid state. In some cases, it is desirable for the solvent to have a high rate of evaporation, a low surface tension, or both.

After application to the substrate, the discrete portions spread (e.g., spontaneously spread or merge) on the surface of the substrate, expelling gas in the interstitial regions between the discrete portions to form a substantially continuous layer of the fluid composition on the substrate. At least some of the solvent in the composition is removed by evaporation. For a composition including a solvent and a polymerizable material, the polymerizable material is polymerized to form a layer of polymerized material on the surface of the substrate. For a composition including a solvent and a dissolved or dispersed solid, a solid layer is formed on the substrate as the solvent evaporates. The substantially continuous liquid layer yields a solid layer substantially free of interstitial voids.

A multiplicity of discrete portions of a fluid composition can be applied to a substrate in a variety of methods, including inkjet dispensing and spray coating. A viscosity of the composition can be chosen based in part on the method of application. For inkjet dispensing, for example, a viscosity of the applied liquid can range up to about 200 cP. Spray coating, for example, in an atomization spray process, can be used to apply fluid compositions with viscosities up to about 2000 cP. Atomization spraying can include use of an ultrasonic spray head (e.g., a liquid atomizer with gas nozzle for directional flow). Ultrasonic spray heads are advantageously clog resistant, as described in U.S. Pat. No. 6,135,357, entitled "Apparatus for atomizing high-viscosity fluids," which is incorporated by reference herein.

The multiplicity of discrete portions can be a uniform or non-uniform, regular or irregular, or random distribution of the discrete portions. In some embodiments, the discrete portions form a pattern, such as a circle, rectangle, or square. In other embodiments, the discrete portions can be arranged non-uniformly or randomly. A volume of some or all of the discrete portions can be pre-determined. Factors used to determine a desired volume of a discrete portion include final imprint feature density (e.g., feature density of mold), residual layer thickness, and the amount of solvent in the composition. The volume of a discrete portion can be, for example, between about 1 pL and about 100 μL, between about 2 pL and about 10 μL, between about 3 pL and about 1 μL, between about 4 pL and about 100 nL, between about 5 pL and 10 nL, or between about 6 pL and about 1 nL. In some cases, it is advantageous for the volume of most or all of the discrete portions to be substantially the same. In other cases, it is advantageous for the volume of some of the discrete portions to be different. The discrete portions can be spaced substantially equidistant or at one or more pre-determined distances from one another on the substrate. FIGS. 3A-D depict some exemplary multiplicities 300 of discrete portions 302 of fluid composition 304 on a substrate 12.

The spacing and volume of the discrete portions can be selected to achieve the desired coverage after the portions have spread to form a substantially continuous layer on the substrate. The desired coverage can be of various geometric shapes and sizes, for example, a rectangular area of about 26×32 mm, or a circular area with a diameter of about 65 mm or about 90 mm. In some embodiments, a depth of the substantially continuous layer is between about 5 nm and about 1 μm. In some cases, a substantially uniform depth of the fluid composition on the surface of the substrate is desirable. In certain cases, it is desirable that a depth of the composition in one area of the substrate exceeds the depth of the composition in another area of the substrate. For example, as depicted in FIG. 4, when mold 20 has a non-uniform feature density, the density of the discrete portions 302 of the fluid composition 304 applied to the substrate 12 can be selected to yield a non-uniform depth, which yields a substantially uniform residual layer 48 after imprinting.

FIG. 5 depicts spreading of discrete portions 302 of a fluid composition 304 on a surface of substrate 12. First, the discrete portions 302 begin to spread on the substrate 12. After some initial spreading, the discrete portions 302 define interstitial region 500. Finally, the discrete portions 302 merge to form a substantially continuous layer 506 of the fluid composition 304 on the substrate 12.

In some cases, spreading of the fluid composition can be limited by the application of a more viscous fluid composition about the perimeter of a multiplicity of discrete portions of the fluid composition. For example, as depicted in FIG. 6, discrete portions 302 of fluid composition 304 on substrate 12 can be surrounded or partially surrounded by discrete portions 602 of another, more viscous fluid composition 604. The discrete portions 602 of the more viscous fluid composition 604 can function as a barrier to the fluid composition 304 and inhibit spreading of the composition beyond the edge or perimeter defined by the more viscous composition. In some embodiments, the more viscous fluid composition 604 is polymerizable material (or solid) with a lower weight percentage of solvent, and the fluid composition 304 is a mixture including, for example, the same polymerizable material (or solid) and a higher weight percentage of the solvent. The more viscous fluid composition 604 inhibits spreading of the less viscous fluid composition 304 beyond the edges or perimeter defined by the more viscous fluid composition.

After evaporation of the solvent, the substantially continuous layer consists essentially of the polymerizable material (or solid), and the composition of the solid layer formed on the substrate is substantially homogeneous.

After the discrete portions spread on the surface of the substrate, some or substantially all of the solvent is allowed to evaporate from the fluid composition. In some cases, the time allowed for evaporation of a solvent from a fluid composition in discrete portions on a substrate ranges from about 1-200 seconds, or from about 2-60 seconds. Solvents are advantageously chosen to reduce or minimize de-wetting of the substrate during evaporation of the solvent.

The time between application of the fluid composition to the substrate and solidification of the layer on the substrate (e.g., initiation of polymerization) allows for evaporation of some or substantially all of the solvent in the fluid composition. To increase throughput efficiency in imprint lithography processes, a first multiplicity and one or more additional multiplicities of discrete portions of fluid composition can be applied to a substrate before the first multiplicity is solidified. Applying multiplicities of discrete portions in a sequential manner allows time for the fluid composition to spread and for the desired amount of solvent to evaporate without limiting overall throughput of the process.

For example, as depicted in FIG. 7, multiplicities 302A-302P are applied to the substrate sequentially. The time allowed for the fluid composition to spread and the solvent to evaporate as desired is such that multiplicity 302A is applied to the substrate, multiplicity 302B is applied to the substrate, and multiplicity 302A is solidified while multiplicity 302C is applied to the substrate. The process continues, such that multiplicity 302B is solidified while multiplicity 302D is applied, multiplicity 302C is solidified while multiplicity 302E is applied, etc. The sequence and time delay between application and solidification is selected based in part on the evaporation rate of the solvent. In some cases, two, three, or more multiplicities are pre-dispensed on the substrate before the first multiplicity is solidified.

In some embodiments, the solid layer formed on the substrate is used to facilitate image transfer, and some or all of the solid layer is intentionally removed from the substrate during processing after solidification. As used herein, "resist material" refers to a polymerizable material, or a solid layer formed from the polymerizable material, at least a portion of which is intentionally removed from the substrate. Forming a resist material on an imprint lithography substrate includes applying a fluid composition including solvent and a polymerizable material on a surface of the substrate, allowing the composition to spontaneously spread to form a substantially continuous layer on the substrate, evaporating at least some of the composition, contacting the composition with a template (or a mold), and polymerizing the polymerizable material between the template and the substrate. Polymerizing the polymerizable material can include, for example, exposure of the material to heat or electromagnetic radiation, such as ultraviolet radiation. The template is removed from the polymerized material after polymerization, and the polymerized (or resist) material remains fixed to the substrate. The resulting resist material on the surface of the substrate can be used as a mask for image transfer, as described in U.S. Pat. No. 7,259,102, entitled "Etching Technique to Planarize a Multi-Layer Structure," which is incorporated by reference herein.

U.S. Pat. No. 7,307,118, entitled "Compositions to Reduce Adhesion Between a Conformable Region and a Mold," which is incorporated by reference herein, lists some exemplary resist materials. Resist materials can include vinyl ethers (e.g., triethylene glycol divinyl ether, tri(4-vinyloxybutyl trimellitate), bis(4-vinyloxybutyl)adipate vinyl ether, vinyl ether terminated polyester polymer), organic modified silicates, acrylates (e.g., isobornyl acrylate, n-hexyl acrylate), diacrylates (e.g., ethylene glycol diacrylate, 1,6-hexanediol diacrylate), methacrylates, epoxies, thiolenes (e.g., 1,2-bis(2-mercaptoethoxy)ethane), isocyanurates, or any combination thereof, along with optional additives such as cross-linkers, initiators (e.g., thermal initiators, photoinitiators), and surfactants.

In one example, a polymerizable material includes about 20-80 wt % isobornyl acrylate (IBOA), about 0-50% n-hexyl acrylate (n-HA), about 10-15% ethylene glycol diacrylate (EGDA), and about 1-5% 2-hydroxy-2-methyl-1-phenyl-propan-1-one. IBOA is available from Sartomer Company, Inc. of Exton, Pa., and is available under the product name SR 506. n-HA provides flexibility to the polymerized material and reduces the viscosity of the bulk material in the liquid phase to range of about 2-9 cP. n-HA is available from the Aldrich Chemical Company of Milwaukee, Wis. EGDA is a cross-linking component that contributes to the modulus and stiffness buildup, as well as facilitates cross-linking of n-HA and IBOA during polymerization of the bulk material. 2-hydroxy-2-methyl-1-phenyl-propan-1-one is a photoinitiator available from Ciba Specialty Chemicals of Tarrytown, N.Y. under the trade name DAROCUR® 1173. The initiator is responsive to a broad band of ultra-violet radiation generated by a medium-pressure mercury lamp. In this manner, the initiator facilitates cross-linking and polymerization of the components of the bulk material. One embodiment of this polymerizable material includes about 55 wt % IBOA, about 27 wt % n-HA, about 15 wt % EGDA, and about 3 wt % of the initiator. Another embodiment of this polymerizable material includes about 47 wt % IBOA, about 25 wt % n-HA, about 25 wt % EGDA, and about 3 wt % of the initiator. These embodiments have a viscosity of about 4 cP.

In another example, a polymerizable material includes about 0-50 wt % GENOMER® 1122, about 20-80 wt % IBOA, about 10-50 wt % 1,6-hexanediol diacrylate, and about 1-5 wt % 2-hydroxy-2-methyl-1-phenyl-propan-1-one. GENOMER® 1122 is an aliphatic urethane acrylate available from Rahn USA Corporation of Aurora, Ill. 1,6-hexanediol diacrylate is available from UCB Chemicals, Smyrna, Ga. To provide improved wetting characteristics of this material, additional fluorinated acrylates, such as 1H,1H-perfluoro-n-decyl acrylate may be included to lower the contact angle of the material. This fluorinated acrylate is available from Exfluor Research Corporation, Round Rock, Tex. under the tradename C10ACRY. The viscosity of this polymerizable material is approximately 11 cP. One embodiment of this polymerizable material includes about 21 wt % GENOMER® 1122, about 56 wt % IBOA, about 20 wt % 1,6-hexanediol diacrylate, and about 3 wt % of the initiator.

In another example, a polymerizable material with a viscosity of about 21 cP includes about 50 wt % IBOA, about 10 wt % GENOMER® 1122, about 3 wt % DAROCUR® 1173, about 25 wt % SR833S, and about 12 wt % PHOTOMER® 8127. SR833S (tricyclodecane dimethanol diacrylate) is a low viscosity difunctional acrylate monomer that is polymerized by free radicals available from Sartomer. PHOTOMER® 8127 is available from Cognis GmbH.

In some embodiments, the solid layer formed on the substrate is used for a purpose other than image transfer. That is, the solid layer formed on the substrate is intended to remain fixed to the substrate. As used herein, a "functional material" refers to a solid or a polymerizable material, or a solid layer formed from the solid or the polymerizable material on a substrate, for a purpose other than image transfer. A functional material can be applied to a substrate to provide a layer with desired characteristics, such as electrical conductivity, on at least a portion of the substrate. In some embodiments, functional materials include dielectric materials, metals, and semiconductors.

When the functional material is formed from a polymerizable material, applying a mixture (e.g., a dispersion or solution) of the polymerizable material and a solvent to a substrate facilitates spreading of the polymerizable material on the substrate. After evaporation of at least some of the solvent, the remaining fluid composition, which may consist essentially of the polymerizable material, can be contacted by a template and solidified by, for example, thermal baking or ultraviolet radiation, while still in contact with the template. In some instances, substantially all of the solvent is removed before polymerization. In other instances, only a portion of the solvent is removed before polymerization, such that the mixture retains a desired amount of solvent during polymerization to yield a porous material. Upon eventual loss of the solvent, the regions occupied by the solvent may become pores in the functional material. These pores can be instrumental in lowering the dielectric constant of a material in the fabrication of low-κ dielectric materials. In some embodiments, a residual amount of solvent may remain in a functional material after polymerization. In other embodiments, the solidified functional material may be substantially solvent-free.

U.S. Patent Publication No. 2006/0081557, entitled "Low-k dielectric functional imprinting materials," which is incorporated by reference herein, describes some polymerizable functional materials, including various silicon-containing materials that can be in the form of polymers or oligomers. Suitable organic polysilica include (i) silsesquioxanes (ii) partially condensed alkoxysilanes (e.g., partially condensed by controlled hydrolysis tetraethoxysilane having a number average molecular weight of about 500 to 20,000); (iii) organically modified silicates having the composition $RSiO_3$ and $R_2SiO_2$, where R is an organic substituent and (iv) partially condensed orthosilicates having the composition $SiOR_4$. Silsesquioxanes are polymeric silicate materials of the type $RSiO_{1.5}$ where R is an organic constituent. The silicon-containing materials can include the element silicon in an amount greater than about 10 wt % or greater than about 20 wt % of the polymerizable fluid composition.

The polymerizable functional material can also include one or more pendant functional groups such as epoxy groups, ketone groups, acetyl groups, vinyl groups, acrylate groups, methacrylate groups, and combinations thereof. Some forms of organic polysilica are of relatively low molecular weight, and can include two or reactive groups per molecule. Such organically modified silicates are available under the trade name "ORMOCER," available from Micro Resist Technology GmbH (Berlin, Germany). These materials can be formed through the controlled hydrolysis and condensation of organically modified silanes, such as alkyltrialkoxysilanes.

In an example, a nanoimprinting process can be used to fabricate organic photovoltaic solar cells from polymerizable functional material. In an imprinting process, the P material can be chosen from several types of electron-donating conjugated polymers, such as polythiophene derivatives, polyphenylene vinylene derivatives, and poly-(thiophene-pyrrole-thiophene-benzothiadiazole) derivatives. The main chain conjugated backbones of these polymers may be unaltered. The side chain derivatives can be altered to incorporate reactive groups including acrylates, methacrylates, thiols, vinyls, epoxies, and combinations thereof, which can crosslink under UV exposure or heat. In some embodiments, the N material is selected from fullerene derivatives, including carbon nanotubes. Fullerenes can be organically modified to attach reactive groups such as thiophene for electro-polymerization, and reactive groups such as acrylates, methacrylates, thiols, vinyls, epoxies, and combinations thereof, which crosslink under UV exposure or heat. Fullerene derivatives also can be imprinted by adding small amount of crosslinkable binding materials.

A solution or dispersion of resist or functional material in certain solvents allows rapid spreading of the solution or dispersion to form a substantially continuous liquid layer on the surface of the substrate, as well as rapid and substantially complete filling of features in a mold or template. Discrete portions of the solvent-diluted material can be placed as desired on a substrate to yield a substantially uniform residual layer, even when the mold or template has a non-uniform feature density. Certain solvents also reduce, minimize, or prevent interstitial gas trapping that can occur in some drop-on-demand processes with more viscous fluid compositions, thereby increasing throughput and reducing defectivity. Thus, selection of a solvent with a desirable combination of properties, such evaporation rate, surface tension, and ability to solubilize or disperse a chosen solid or polymerizable material, yields the surprising and unexpected combination of the advantages of spin-coating methods as well as drop-on-demand coating methods, without some or all of the associated disadvantages.

A solvent used to solubilize or disperse a solid or polymerizable material for imprint lithography is advantageously high in purity, substantially metal-ion-free, and does not leave a residue or re-deposit after evaporation. Solvents which are safe, non-flammable, and/or environmentally friendly are especially advantageous. Desirable properties of the solvent may be based on properties of the polymerizable material. For instance, the boiling point of the solvent can be chosen such the solvent is more volatile than the polymerizable material. In some cases, the boiling point of the solvent can be less than about 150° C. or less than about 100° C. In some cases, a solvent with a relatively low boiling point also has a relatively high vapor pressure. A relatively low boiling point, relatively high vapor pressure, or a combination thereof allows solvent evaporation at ambient temperatures in imprint lithography processes.

One example of a class of solvents particularly suitable for resist materials includes fluorinated ethers with the formula $R_f$—X—R, in which $R_f$ includes carbon and fluorine, X is a divalent atom such as oxygen, and R is an alkyl group. $R_f$ can include fluorinated or perfluorinated carbons. Examples of fluorinated ethers include (A) methyl nonafluorobutyl ether, (B) ethyl nonafluorobutyl ether, and (C) 2-trifluoromethyl-3-ethoxydodecafluorohexane, shown below.

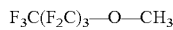

A: Methyl nonafluorobutyl ether

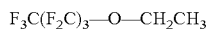

B: Ethyl nonafluorobutyl ether

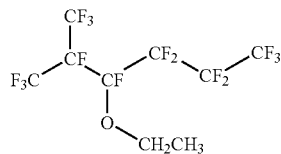

C: 2-trifluoromethyl-3-ethoxydodecafluorohexane

Solvents such chloroform, xylene, and chlorobenzene, are particularly useful for forming dispersions and solutions of functional materials. For a functional material in the form of a sol-gel, suitable solvents include an aqueous mixture of one or more alcohols, such as propanol.

In some embodiments, the fluid composition includes about 0-99.8 wt % solvent, or about 5-50 wt % solvent. The ratio of solvent to the solid or polymerizable material can be chosen based on surface tension, viscosity, and rate of evaporation of the solvent, as well as the viscosity or solubility of the solid or polymerizable material, and desired viscosity and spreading rate of the mixture, including the spreading fluid front viscosity. Materials dissolved or dispersed in solvents with lower surface tension tend to spread further than the same materials dissolved or dispersed in solvents with higher surface tension. If two solvents have similar surface tension and viscosity, the solvent that evaporates more slowly allows greater spreading of dissolved or dispersed materials. In an example, a mixture including 50 wt % of solvent B (ethyl nonafluorobutyl ether) spreads to cover about 25% more surface area than the same material diluted with 50 wt % of solvent A (methyl nonafluorobutyl ether).

Other factors that affect choice and amount of solvent include method of application, distance the discrete portions of fluid composition travel between the applicator and the substrate, environmental conditions (temperature, humidity, etc.) under which the discrete portions are applied, time allowed for evaporation of the solvent after application of the discrete portions to the substrate, and desired thickness of the solidified layer.

The processibility of a functional material that is an insoluble solid can be enhanced by forming a fluid composition (e.g., dispersion) that includes the solid and a solvent. Examples of insoluble functional materials include inorganic substances, metal-containing particles, such as $TiO_2$, and fullerenes and other forms of carbon, including carbon nanotubes. The composition is applied to a surface of a substrate. The surface of the substrate can be planar or non-planar. For example, as shown in FIG. 8, the substrate 12 can be a patterned layer formed by nanoimprint lithography. Discrete portions 302 of the fluid composition 804 can be applied to the surface of the substrate 12. The discrete portions spread to form a substantially continuous layer 806 on the surface of the substrate. Evaporation of the solvent leaves a substantially continuous solid layer of the functional material on the surface of the substrate. The solid layer can be substantially planar, or can conform to a shape of the surface of the substrate.

In an exemplary process that includes functional material that is soluble in a solvent and functional material that is insoluble in a solvent, nanoimprinting is used to pattern an N-type material on a substrate in the fabrication of an organic photovoltaic cell. The N-type material can be, for example, an insoluble functional material such as $TiO_2$ in a sol-gel formed with water and 2-propanol. A patterned layer can be formed by solidifying the $TiO_2$ sol-gel between a substrate and a mold. Another layer of functional material can be formed on the patterned $TiO_2$ layer. A solid precursor such as poly(3-hexylthiophene) can be dissolved in a solvent such as chloroform, xylene, or chlorobenzene. Discrete portions of the solution can be applied to the surface of the $TiO_2$ layer. After the discrete portions merge or spread to form a substantially continuous layer and the solvent is evaporated, a solid layer of poly(3-heyxlythiophene) remains on the $TiO_2$ layer, and functions as a P-type material.

A number of embodiments of the invention have been described. Nevertheless, it will be understood that various modifications may be made without departing from the spirit and scope of the invention. Accordingly, other embodiments are within the scope of the following claims.

What is claimed is:

1. An imprint lithography method, comprising:
applying a liquid composition onto a surface of an imprint lithography substrate to form a multiplicity of spaced-apart, discrete portions of the liquid composition on the surface of the imprint lithography substrate, wherein the composition comprises:
a solvent; and
a polymerizable material;
then allowing the spaced-apart, discrete portions of the liquid composition to spontaneously spread and merge on the surface of the imprint lithography substrate to form a substantially continuous layer of the liquid composition with a depth between about 5 nm and about 1 µm on the surface of the imprint lithography substrate and with an exposed liquid surface, formed by the spreading of the discrete portions of the liquid composition, opposite the surface of the imprint lithography substrate;
evaporating at least some of the solvent from the exposed, substantially continuous layer of the liquid composition having a depth between about 5 nm and about 1 µm; and
polymerizing the polymerizable material to form a solid layer of polymerized material on the imprint lithography substrate, wherein the solid layer of polymerized material is substantially free of interstitial voids.

2. The method of claim 1, wherein applying the liquid composition comprises dispensing the liquid composition with an inkjet.

3. The method of claim 1, wherein applying the liquid composition comprises spraying the liquid composition with an atomization spray head.

4. The method of claim 1, wherein applying the liquid composition comprises spraying the liquid composition with an ultrasonic spray head.

5. The method of claim 1, wherein each of the spaced-apart, discrete portions of the liquid composition on the surface of the imprint lithography substrate has a pre-determined volume, and the pre-determined volume differs for at least two of the spaced-apart, discrete portions of the liquid composition on the surface of the imprint lithography substrate.

6. The method of claim 1, wherein the multiplicity of spaced-apart, discrete portions of the liquid composition forms a pattern on the surface of the imprint lithography substrate.

7. The method of claim 1, further comprising applying spaced-apart, discrete portions of a second liquid composition about a perimeter of the multiplicity of spaced-apart, discrete portions of the liquid composition on the surface of the imprint lithography substrate to limit spreading of the liquid composition on the imprint lithography substrate, wherein the second liquid composition is more viscous than the liquid composition.

8. The method of claim 7, further comprising contacting the exposed, substantially continuous layer of the liquid composition from which at least some of the solvent has evaporated with an imprint lithography template and polymerizing the polymerizable material between the imprint lithography template and the imprint lithography substrate.

9. The method of claim 1, wherein the exposed, substantially continuous layer of the liquid composition is substantially uniform in thickness.

10. The method of claim 1, wherein the surface of the imprint lithography substrate is non-planar.

11. The method of claim 1, wherein evaporating at least some of the solvent comprises evaporating substantially all of the solvent.

12. The method of claim 1, wherein evaporating at least some of the solvent comprises allowing the solvent to evaporate for a pre-determined length of time.

13. The method of claim 12, wherein the pre-determined length of time is greater than about 1 second and less than about 200 seconds.

14. The method of claim 1, further comprising:
sequentially applying one or more additional multiplicities of spaced-apart, discrete portions of the liquid composition onto the surface of the imprint lithography substrate, wherein each multiplicity is spatially separated from the one or more other multiplicities;
then allowing the multiplicities of the spaced-apart, discrete portions of the liquid composition to spontaneously spread and merge on the surface of the imprint lithography substrate such that each of the multiplicities of the spaced-apart, discrete portions of the liquid composition forms an additional exposed, substantially continuous layer of the liquid composition on the surface of the imprint lithography substrate, wherein each additional exposed, substantially continuous layer of the liquid composition is spaced apart from the other additional exposed, substantially continuous layers of the liquid composition; and
evaporating at least some of the solvent from each additional exposed, substantially continuous layer of the liquid composition.

15. The method of claim 14, further comprising:
contacting a first one of the additional exposed, substantially continuous layers of the liquid composition from which at least some of the solvent has evaporated with a surface of an imprint lithography template;
polymerizing the polymerizable material in the first one of the additional exposed, substantially continuous layers;
separating the surface of the imprint lithography template from the polymerized material; and
then contacting another one of the additional exposed, substantially continuous layers of the liquid composition with the surface of the imprint lithography template.

16. The method of claim 1, wherein the polymerizable material comprises a component selected from the group consisting of acrylates, methacrylates, epoxies, isocyanurates, and thiolenes.

17. The method of claim 1, wherein the solid layer of polymerized material is a resist layer.

18. The method of claim 1, wherein the solid layer of polymerized material is a functional layer.

19. An imprint lithography method, comprising:
applying a liquid composition onto a surface of an imprint lithography substrate to form a multiplicity of spaced-apart, discrete portions of the liquid composition on the surface of the imprint lithography substrate, wherein the composition comprises:
a solvent; and
a solid;
then allowing the spaced-apart, discrete portions of the liquid composition to spontaneously spread and merge on the surface of the imprint lithography substrate to form a substantially continuous layer of the liquid composition with a depth between about 5 nm and about 1 µm on the surface of the imprint lithography substrate and with an exposed liquid surface, formed by the spreading of the discrete portions of the liquid composition, opposite the surface of the imprint lithography substrate;

evaporating at least some of the solvent from the exposed, substantially continuous layer of the liquid composition having a depth between about 5 nm and about 1 µm to form a layer of the solid on the imprint lithography substrate, wherein the solid layer is substantially free of interstitial voids.

20. The method of claim 19, wherein the imprint lithography substrate is a patterned layer.

21. The method of claim 19, wherein the solid layer comprises functional material.

22. The method of claim 19, wherein the liquid composition is a solution.

23. The method of claim 19, wherein the liquid composition is a dispersion.

24. The method of claim 19, wherein the solid comprises a polymeric material.

25. The method of claim 19, wherein the solid comprises fullerenes or carbon nanotubes.

26. The method of claim 19, wherein the solid comprises metal-containing particles.

27. A method of forming a polymerized layer on an imprint lithography substrate, the method comprising:
    selecting a liquid composition comprising:
        a polymerizable material; and
        a solvent having a structure comprising $R_f$—X—R, wherein:
            $R_f$ comprises fluorine and carbon,
            R comprises an alkyl group, and
            X is a divalent atom;
    applying the liquid composition onto a surface of an imprint lithography substrate to form a multiplicity of spaced-apart, discrete portions of the liquid composition on the surface of the imprint lithography substrate; then allowing the spaced-apart discrete portions of the liquid composition to spontaneously spread and merge on the surface of the imprint lithography substrate to form a substantially continuous layer of the liquid composition with a depth between about 5 nm and about 1 µm on the surface of the imprint lithography substrate and with an exposed liquid surface, formed by the spreading of the discrete portions of the liquid composition, opposite the surface of the imprint lithography substrate;
    evaporating at least some of the solvent from the exposed, substantially continuous layer of the liquid composition having a depth between about 5 nm and about 1 µm; and
    polymerizing the polymerizable material to form a solid layer of polymerized material on the imprint lithography substrate, wherein the solid layer of the polymerized material is substantially free of interstitial voids.

28. The method of claim 27, wherein the polymerizable material comprises a component selected from the group consisting of acrylates, methacrylates, epoxies, isocyanurates, and thiolenes.

29. The method of claim 27, wherein the boiling point of the polymerizable material is greater than about 250° C.

30. The method of claim 27, wherein the boiling point of the solvent is less than about 150° C.

31. The method of claim 30, wherein the boiling point of the solvent is less than about 100° C.

32. The method of claim 27, wherein the solvent is a fluorinated ether.

33. The method of claim 27, wherein $R_f$ is a fluorinated alkyl group.

34. The method of claim 33, wherein $R_f$ is a perfluorinated alkyl group.

35. The method of claim 27, wherein R is an alkyl group.

36. The method of claim 27, wherein X is oxygen.

* * * * *